(12) United States Patent
Ogushi et al.

(10) Patent No.: US 6,867,843 B2
(45) Date of Patent: Mar. 15, 2005

(54) DEBRIS REMOVING SYSTEM FOR USE IN X-RAY LIGHT SOURCE

(75) Inventors: Nobuaki Ogushi, Utsunomiya (JP); Yutaka Watanabe, Tochigi-ken (JP); Akira Miyake, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/187,852

(22) Filed: Jul. 3, 2002

(65) Prior Publication Data

US 2003/0020890 A1 Jan. 30, 2003

(30) Foreign Application Priority Data

Jul. 5, 2001 (JP) ........................ 2001-205319

(51) Int. Cl.⁷ ................ G03B 27/52; G03B 27/72; G21K 5/00; G21K 1/04
(52) U.S. Cl. .................. 355/30; 355/71; 378/34; 378/160
(58) Field of Search ............... 355/30, 67, 71; 378/34, 160

(56) References Cited

U.S. PATENT DOCUMENTS

| | | | |
|---|---|---|---|
| 4,408,338 A | 10/1983 | Grobman | 378/34 |
| 5,549,994 A | 8/1996 | Watanabe et al. | 430/5 |
| 5,896,438 A | 4/1999 | Miyake et al. | 378/34 |
| 6,038,279 A | 3/2000 | Miyake et al. | 378/34 |
| 6,317,479 B1 | 11/2001 | Chiba et al. | 378/35 |
| 2002/0090054 A1 * | 7/2002 | Sogard | 378/119 |

FOREIGN PATENT DOCUMENTS

| | | |
|---|---|---|
| JP | 9-320792 | 12/1997 |
| JP | 2001-57298 | 2/2001 |
| JP | 2001-68297 | 3/2001 |
| WO | WO 96/10324 | 4/1996 |
| WO | WO 01/37309 | 5/2001 |

OTHER PUBLICATIONS

European Search Report dated Oct. 3, 2002, issued in corresponding European patent appln. No. 02254687.3-1231, forwarded in a Communication dated Oct. 25, 2002.

* cited by examiner

*Primary Examiner*—Rodney Fuller
(74) *Attorney, Agent, or Firm*—Fitzpatrick, Cella, Harper & Scinto

(57) ABSTRACT

A debris removing system prevents debris from being scattered from an X-ray source. The debris removing system includes an attracting unit, disposed between a light emission point of the X-ray source and the optical system, for attracting debris. The attracting unit has an attracting surface parallel or approximately parallel to an axis passing through the light emission point. The debris removing system further includes a rotation unit for rotating the attracting unit about the axis. This debris removing system assures a superior debris removing effect and a good EUV light utilization efficiency, being compatible with each other.

13 Claims, 13 Drawing Sheets

DEBRIS REMOVING SYSTEM FOR USE IN X-RAY LIGHT SOURCE

FIELD OF THE INVENTION AND RELATED ART

This invention relates generally to an X-ray projection exposure apparatus or X-ray proximity exposure apparatus for transferring a fine pattern in semiconductor manufacture. More particularly, the invention concerns an X-ray light source which can be used in such an exposure apparatus, for example.

In accordance with recent requirements for further reduction in size and thickness of electronic instruments, the need for further minimization of a semiconductor device to be incorporated into an electronic instrument increases more and more. Conventionally, as a lithographic method for the manufacture of semiconductor devices, there is a reduction projection exposure method using ultraviolet rays. In such reduction projection exposure, the smallest size to be transferred is proportional to the wavelength of light used for the transfer process, and it is inversely proportional to the numerical aperture of a projection optical system. Thus, for transfer of circuit patterns of smaller linewidths, the wavelength of exposure light has been shortened such as on an order of a Hg lamp i-line (wavelength 365 nm), a KrF excimer laser (wavelength 248 nm), and an ArF excimer laser (wavelength 193 nm).

However, miniaturization of semiconductor devices has advanced quickly, and there is a limitation in the lithography using ultraviolet light. In consideration of this, many attempts have been made to develop projection exposure apparatuses using, as exposure light, soft X-rays (called EUV: Extreme Ultra-Violet light) having a wavelength of 10 to 15 nm, much shorter than the ultraviolet rays.

As an example of such an EUV light source, a laser plasma light source may be used. In such a light source, pulse laser light having a large intensity is projected onto a target material which is disposed in a vacuum container, to produce high-temperature plasma. EUV light emitted from the plasma and having a wavelength of about 13 nm, for example, is used. As regards the target material, a method thin film, an inert gas, or liquid drops may be used. The target material is supplied into the vacuum container by means of a gas jet, for example. In order to enlarge the average intensity of the EUV light emitted from the target, the repetition frequency of the pulse laser should be made higher, and thus, usually, the operation is carried out at a repetition frequency of a few KHz.

However, in the laser plasma method as an example of the EUV light source method, although EUV light is produced in response to projection of large-intensity pulse laser light upon a target, the pulse laser projection creates, on the other hand, scattered particles, being called debris. This may cause contamination of or damage to optical elements, and may lead to a decrease of the reflectivity. Proposals have been made in relation to a debris removing system for preventing contact of debris, from a target, to optical elements.

FIGS. 11 and 12 show debris removing systems 500 and 600, respectively. A rotary member 510 (or 610) is controlled so that its opening 520 (620) intersects with an optical axis. Further, the rotary member 510 (610) is controlled by a control circuit 570 (670) to be synchronized with the pulse emission of a pulse laser 550 (650). Furthermore, the rotary member 510 (610) is rotated by a motor 540 (640) through a shaft 530 (630). EUV light 580 (680) is produced in response to impingement of the pulse laser 550 (650) against a target 560 (660). Here, debris 590 (690) is removed on the basis of a speed difference with respect to the EUV light 580 (680), such that only the EUV light 580 (680) can be extracted.

FIG. 13 shows an X-ray producing unit such as shown in Japanese Laid-Open Patent Application, Laid-Open No. 9-320792. In this unit, an excitation energy beam 904 is projected against a target material 902, by which plasma 906 is produced. Particles emitted at that time from the plasma 906 are blocked by members 908 and 910, whereby debris is removed. Further, in a pyramid region 912 corresponding to a range for X-ray extraction, a member 918 having a shaft 914 and blades 916 is used and, by rotating the blades 916 about the rotary shaft 914, scattered particle are adhered to the blades 916, whereby debris is removed.

There are other proposals such as the use of a shutter mechanism for providing opening/closing motion in synchronism with the light emission or use of a filter, for removing debris.

It has been recognized that the inconveniences caused by debris apply not only to the laser plasma method but also to a discharging method in which a gas such as Xe, for example, is caused to flow between electrodes and, through the electrical discharge between the electrodes, plasma is produced and EUV light is emitted.

However, in the debris removing methods such as described above, a sufficient debris removing effect and a good EUV light utilization efficiency are not compatible with each other. In exposure apparatuses, the throughput is one basic performance and, in order to improve this, the intensity of light for exposure of a wafer must be enlarged. In view of it and in order to increase the EUV light utilization efficiency, a condensing mirror may preferably be used to enlarge the taking angle to about $\pi$ steradian. However, in order to enlarge the taking angle in the shutter method, the window must be widened and, as a result of it, the debris removing efficiency would be lowered. In the filter method, on the other hand, in order to reduce the thermal influence from the light emission point, a certain distance must be kept. If, therefore, the taking angle is enlarged, the filter must be enlarged in size and also in thickness. This leads to an undesirable result of large attenuation of EUV light by absorption of the filter and, additionally, periodic filter replacement becomes necessary.

SUMMARY OF THE INVENTION

It is accordingly an object of the present invention to provide a debris removing system by which both a superior debris removing effect and a good EUV light utilization efficiency are made compatible with each other.

It is another object of the present invention to provide an exposure apparatus using such a debris removing system.

In accordance with an aspect of the present invention, there is provided a debris removing system for preventing debris, being scattered from an X-ray source, from reaching an optical system, the debris removing system comprising: an attracting unit disposed between a light emission point of the X-ray source and the optical system, for attracting debris, the attracting unit having an attracting surface parallel to or approximately parallel to an axis passing through the light emission point; and a rotation unit for rotating said attracting unit about the axis. In accordance with such a debris removing system, since the attracting surface is disposed parallel to or approximately parallel to light rays emitted from the light source, it can attract debris without blocking the light.

In one preferred form of this aspect of the present invention, the attracting unit includes fins of a number n, functioning as said attracting surface, wherein the fins have a length d(m) in a divergent direction of X-rays, wherein said rotation unit rotates the fins about the axis at a rotational speed ω(rad/sec), and wherein, when an average speed of the debris is vm(m/sec), there is a relation $100 \leq nd\omega/(2\pi)$. When this relation is satisfied, debris of a velocity vc=100 (m/sec) or less can be removed completely.

In another preferred form, the attracting unit includes fins of a number n, function a said attracting surface, wherein the fins have a length d(m) in a divergent direction of X-rays, wherein said rotation unit rotates the fins about the axis at a rotational speed ω(rad/sec), and wherein, when an average speed of the debris is vm(m/sec), there is a relation $\{nd\omega/(2\pi vm)\} \geq \frac{1}{2}$. When this relation is satisfied, the X-ray utilization efficiency becomes equal to 50% or more.

In accordance with another aspect of the present invention, there is provided a debris removing system for preventing debris, being scattered from an X-ray source, from reaching an optical system, the debris removing system comprising: an attracting unit disposed between a light emission point of the X-ray source and the optical system, for attracting debris, said attracting unit having an attracting surface parallel to or approximately parallel to an axis passing through the light emission point; and a rotation unit for rotating said attracting unit about a predetermined axis, at a rotational speed of ω(rad/sec); wherein there is a relation vc=100 $\leq nd\omega/(2\pi)$, to enable removal of debris having a velocity of vc=100 (m/sec). In accordance with such a debris removing system, by rotating the attracting surface about the axis, debris being scattered from the light emission point toward the optical system can be attracted to the attracting, surface. Further, since the attracting unit is disposed parallel to or approximately parallel to the light rays emitted from the light source, it can remove debris without blocking the EUV light (or with a decreased amount of EUV light interception) and without decreasing the utilization efficiency. When the aforementioned relation is satisfied, debris having a velocity of vc=100 (m/sec) can be removed completely or mostly.

In accordance with a further aspect of the present invention, there is provided a debris removing system for preventing debris, being scattered from an X-ray source, from reaching an optical system, the debris removing system comprising: an attracting unit disposed between a light emission point of the X-ray source and the optical system, for attracting debris, said attracting unit having an attracting surface parallel to or approximately parallel to an axis passing through the light emission point; and a rotation unit for rotating said attracting unit about a predetermined axis, wherein said attracting unit includes fins of a number n, functioning as said attracting surface, wherein the fins have a length d(m) in a divergent direction of X-rays, wherein the following relations are satisfied:

$$S_0 = \pi(r_1^2 - r_0^2)$$

$$S_1 = (n/2)(r_1 - r_0)d \sin \phi$$

$$E = (1 - S_1/S_0) \times 100$$

$$E \geq 50$$

$$0 \leq \phi \leq \arcsin(\pi(r_1 + r_0)/(nd))$$

where $r_0$ is a radius of the rotation unit about the predetermined axis, $r_1$ is a radius of the attracting unit about the predetermined axis, $S_0$ is an area through which X-rays from the light emission point can pass, φ is a tilt angle ($0 \leq \phi < \pi/2$) defined between the rotational axis and a straight line connecting the light emission point and a midpoint of the rotation unit along the predetermined axis, $S_1$ is an area for blocking the light with the fins, and E is the utilization efficiency (%) being defined so that the utilization efficiency becomes equal to 100% when the predetermined axis and the straight line are registered with each other.

In accordance with such a debris removing system, since the attracting surface is disposed parallel to or approximately parallel to light rays emitted from the light source, it can attract debris without blocking the light. Since the attracting surface rotates about an axis passing through the light emission point, there is no possibility of blocking the light with any axis and, therefore, the utilization efficiency is not decreased. Further, when the aforementioned relation is satisfied, debris can be removed completely In accordance with a yet further aspect of the present invention, there is provided an illumination system for illuminating a mask, the system comprising: a debris removing system as discussed above, for passing X-rays from an X-ray source therethrough; and an optical system for directing X-rays from said debris removing system toward a mask. In accordance with such an illumination system, since debris is removed by the debris removing system, deposition of debris on a mirror can be avoided, such that a mask having a pattern formed thereon can be illuminated without a decrease in reflectivity of the illumination.

In accordance with a still further aspect of the present invention, there is provided an exposure apparatus for exposing a workpiece, comprising: and illumination system as recited above; and a projection optical system for projecting X-rays from the mask onto the workpiece.

In accordance with a yet further aspect of the present invention, there is provided a light source unit, comprising: an X-ray source for producing X-rays in accordance with a laser plasma method or a gas discharging method; and a debris removing system as recited above. Because of the use of a debris removing system, debris produced at the light emission point can be removed effectively, such that a decrease of reflectivity of a condensing mirror can be reduced considerably. Further, since the attracting surface is parallel to or approximately parallel to the light rays from the optical system, it can attract debris without blocking the light.

In accordance with a still further aspect of the present invention, there is provided a device manufacturing method which comprises a projection exposure step for exposing a workpiece by use of an exposure apparatus such as described above, and a step of performing a predetermined process to the exposed workpiece. The scope of protection by a claim directed to a device manufacturing method having similar functions as those of an exposure apparatus described above, covers a device itself which may be an intermediate or a final product. Also, such devices may include a semiconductor chip (an LSI or VLSI, for example), a CCD, an LDC, a magnetic sensor and a thin film magnetic head, for example.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
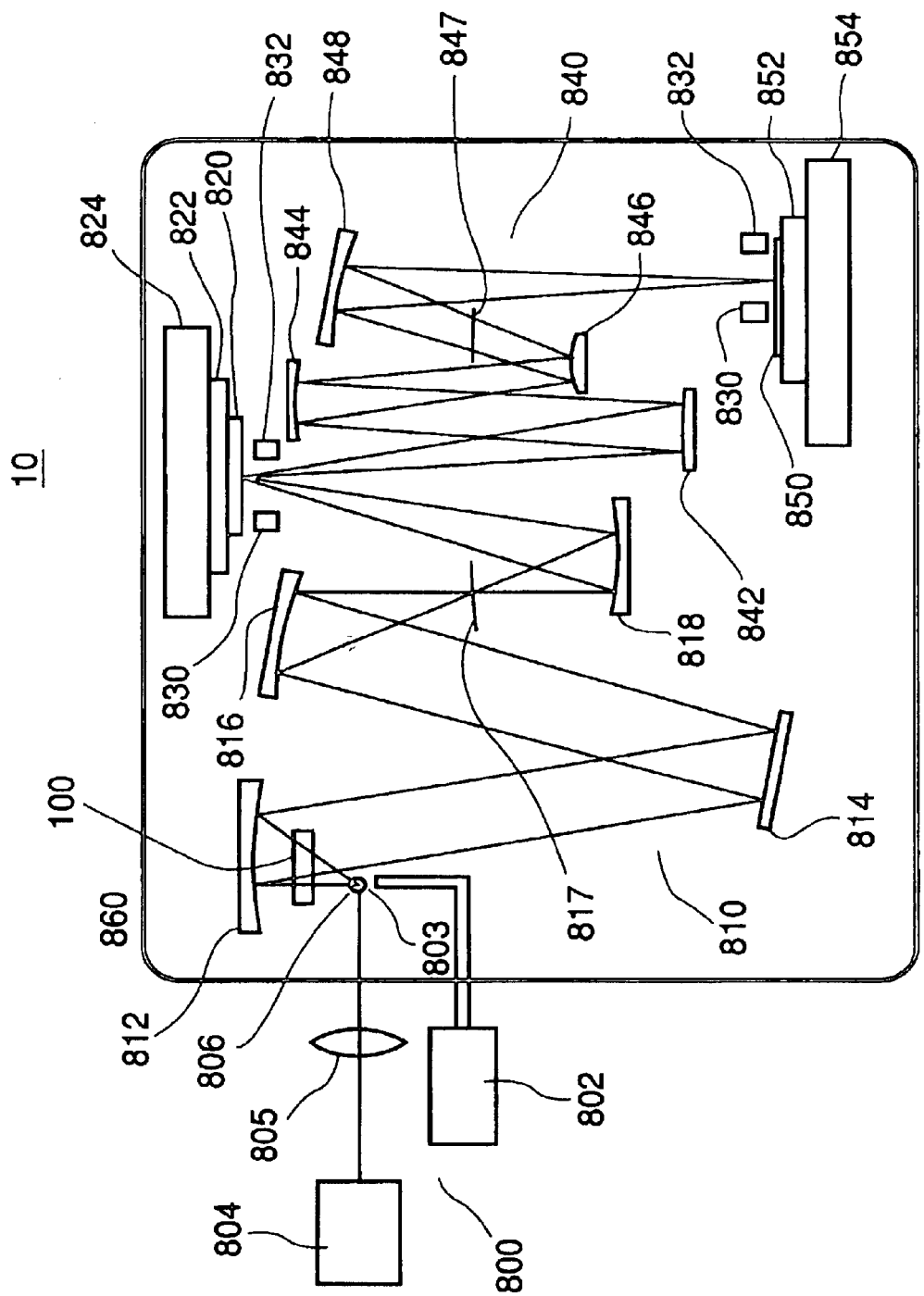
FIG. 1 is a schematic view of an EUV exposure apparatus.

Referring now to the drawings, an exposure apparatus 10, which uses a debris removing system 100 according to an embodiment of the present invention, will now be described. In the drawings, the same reference numerals denote corresponding elements.

FIG. 1 is a schematic view of the exposure apparatus 10. The exposure apparatus 10 is an X-ray projection exposure apparatus in which step-and-scan exposure is to be carried out by use of EUV light (for example, having a wavelength of 13.4 nm) as exposure light.

As shown in FIG. 1, the exposure apparatus 10 comprises an EUV light source 800, a debris removing system 100, an illumination optical system 810, a reflection type reticle (reflection type mask) 820, an alignment optical system 830, a projection optical system 840, a reticle stage 824, and a wafer stage 854. The components from the debris removing system to the wafer stage 854 are accommodated in a vacuum container 860.

The EUV light source 800 of this embodiment uses laser plasma, for example. In the laser plasma light source 800, a target supplying unit 802 supplies a target material 803, and a pulse laser 804 supplies a large intensity pulse laser, which is projected to the target material 803 through a condensing lens 805. In response to it, high-temperature plasma 806 is produced, from which EUV light having a wavelength of about 13 nm is emitted. The target material may be a metal thin film, an inert gas or liquid drops. The target material is supplied into the vacuum container 860 by means of the target supplying unit 802, which is based on a gas jet, for example. In order to enlarge the average intensity of the EUV light emitted from the target, the repetition frequency of the pulse laser 804 should be made higher, and thus, usually, the operation is carried out at a repetition frequency of a few KHz. A discharging plasma light source may be used as the EUV light source 800. On that occasion, a gas is caused to flow around an electrode disposed inside the vacuum container 860, and a pulse voltage is applied to the electrode to cause electrical discharging, whereby high-temperature plasma 806 is produced. From this plasma 806, EUV light having a wavelength of about 13 nm is emitted and this may be used.

The illumination optical system 810 uses EUV light from the EUV light source 800 to illuminate a mask or reticle 820 (in the present invention, they can be used interchangeably). In this embodiment, the illumination optical system 810 comprises first to third mirrors 812, 816 and 818, an optical integrator 814, and an aperture 817. The first mirror 812 functions to collect EUV light approximately isotropically emitted from the plasma 806. The optical integrator 814 has a function to uniformly illuminate the reticle 820 at a predetermined numerical aperture. Disposed at a position inside the illumination optical 810, which is optically conjugate with the reticle 820, is an aperture 817 for defining, in an arcuate shape, the region upon the reticle 820 surface to be illuminated.

Figures 2A, 2B:
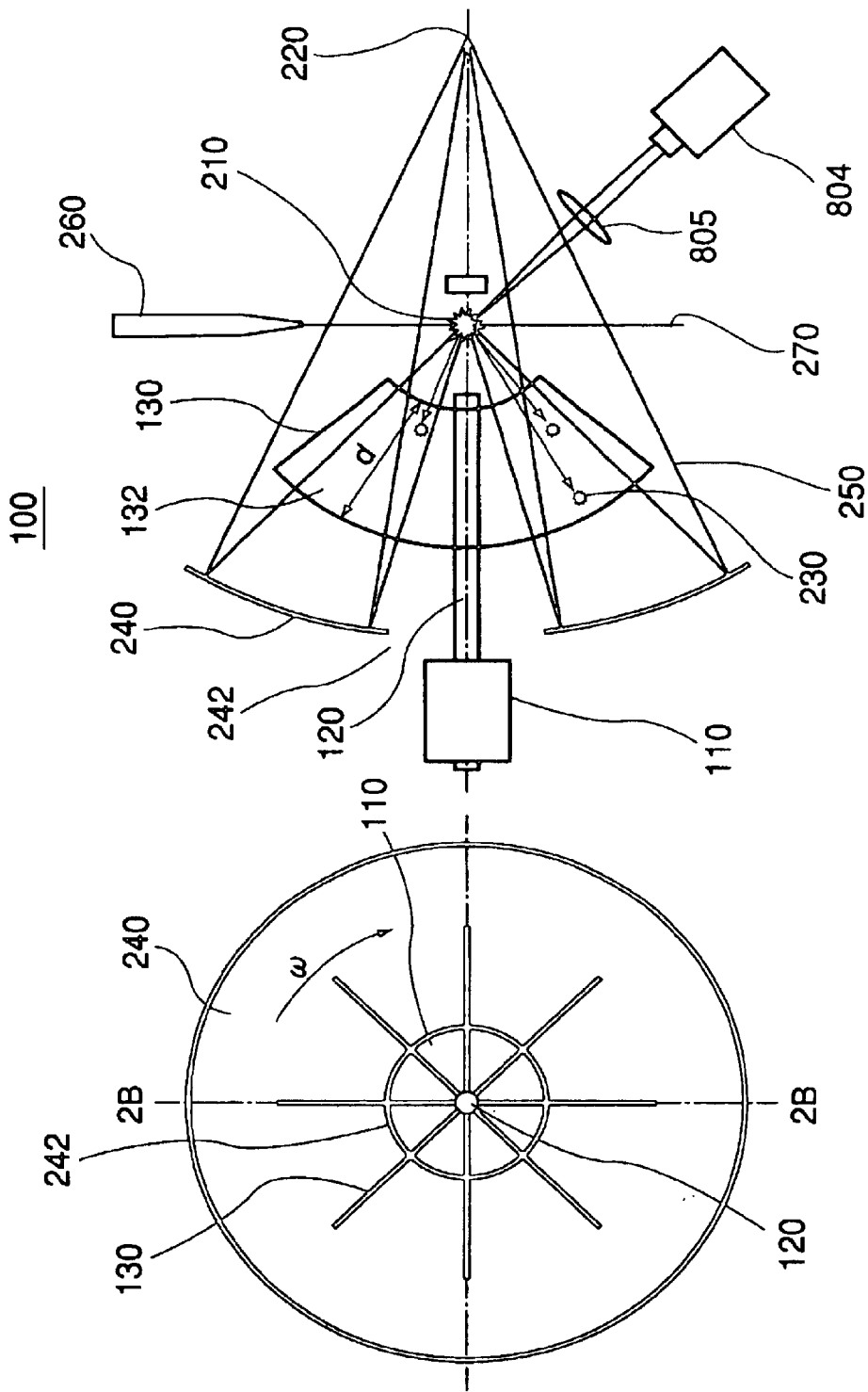
FIG. 2A is a schematic view of a debris removing system according to an embodiment of the present invention.
FIG. 2B is a laser plasma light source and a debris removing system according to an embodiment of the present invention.

The debris removing system 100 is disposed between the light emission point and the optical elements. FIGS. 2A and 2B show the structures of the laser plasma light source 804 and the debris removing system 100, which can be incorporated into the exposure apparatus 100 of FIG. 1. FIG. 2A is a front view of the debris removing system, and FIG. 2B is a plan view showing the disposition of the debris removing system 100 and the light source 800. In FIG. 2B, the debris removing system 100 is illustrated in a sectional view, taken along a broken line 2B—2B in FIG. 2A.

The laser plasma light source 804 shown in FIG. 2B is based on a laser plasma method in which a target material 270 such as Xe, for example, is supplied to a light emission point 210 by means of a target material supplying nozzle 260, and, on the other hand, pulse laser light 804 is projected through a condenser lens 805 to the target material 270, whereby EUV light is produced. Debris which may be produced simultaneously with the production of EUV light is removed by the debris removing system 100.

As shown in FIGS. 2A and 2B, the debris removing system 100 comprises a motor 10, a shaft 120, and plural fins 130. The fins 130 are disposed between a light emission point 210 and a condensing mirror 240 (which corresponds to the first mirror 812 in FIG. 1). The motor 10 is disposed at the back of the condensing mirror 240, and the shaft 120 extends through a bore 242. By means of the motor and through the shaft, the fins 130 are rotated at revolutions ω(rad/sec).

Figure 13:
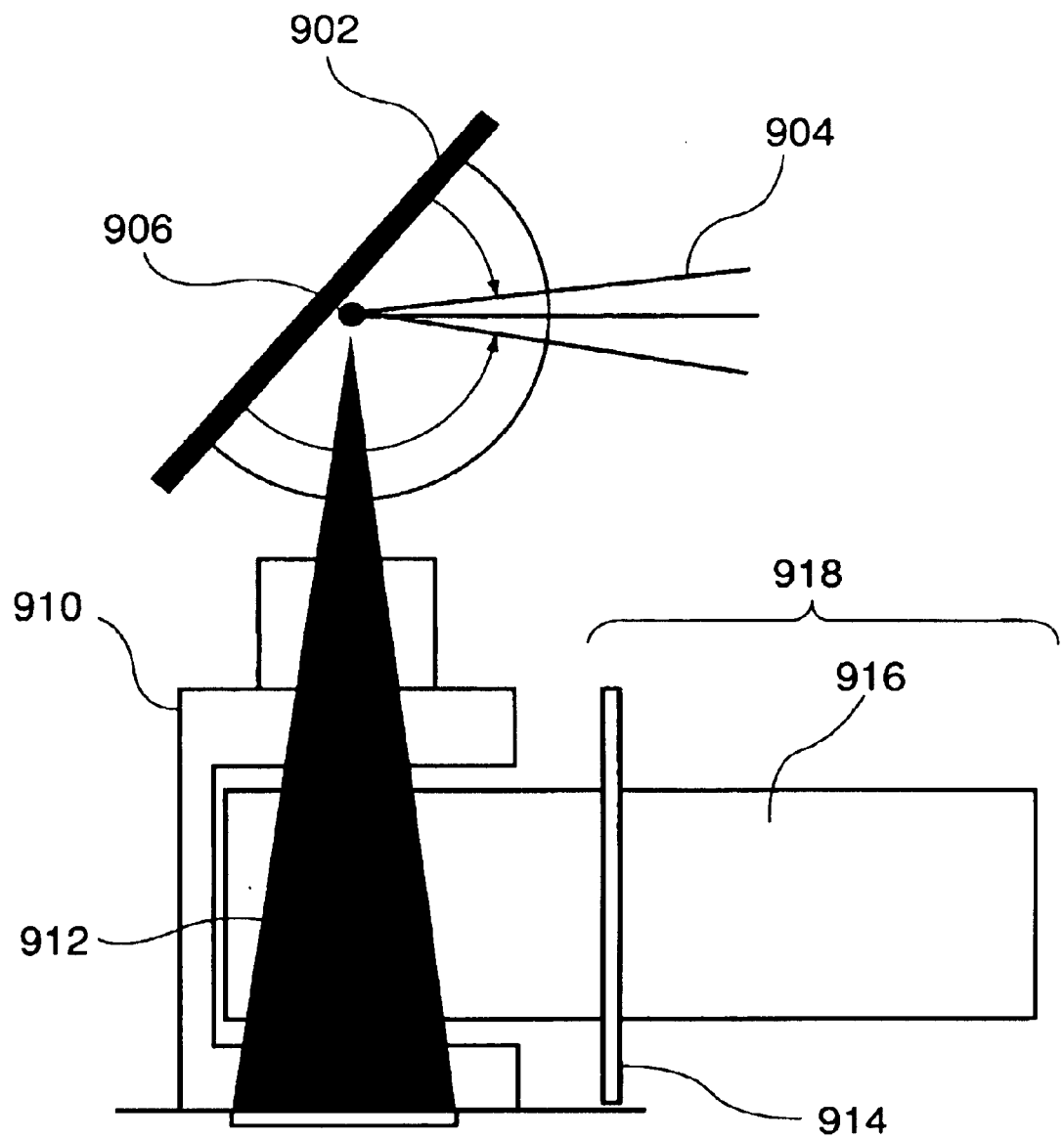
FIG. 13 is a schematic view of a debris removing system of a known type.

The motor 110 rotates the shaft 120 and the fins 130 fixed to the shaft 120. The shaft 120 has plural fins 130 of the same shape attached thereto, and it functions as a rotary shaft for rotating the fins 130. Specifically, the rotary shaft is disposed to pass through the light emission point 210 which corresponds to the point 806 in FIG. 1. With this arrangement, creation of a light blocking zone due to axial misregistration between the shaft 120 and the optical axis can be suppressed to a minimum. Further, there is an advantage that, as compared with the conventional example of FIG. 13, the rotational speed of the fins can be increased easily.

The fins 130 function as an attracting portion for attracting debris 230. In this embodiment, the fins 130 comprise eight thin plates of a fan shape, which are mounted to the shaft 120 equidistantly. The fins 130 have a thickness which is made as small as possible so as to minimize the zone to be light-blocked, in terms of projected area as seen from the light emission point 210 and a convergence point 220. The fins 130 are mounted to the shaft 120 equiangularly, with an angle of 45 deg. In the example shown in FIGS. 2A and 2B, the number of fins 130 is eight. Also, the shape of the fins is not limited to a fan shape. However, when a fan shape is used, there is an advantage that uniform debris removing performance is assured with respect to the angular direction as seen from the light emission point 210. As a matter of course, all the fins 130 may not have the same shape.

The fins 130 are disposed parallel to or approximately parallel to an optical axis, extending from the light emission point 210 to the optical system. Here, the words "approximately parallel" are used to include widely, for example, a case wherein the shaft 120 is inclined with respect to the optical axis, and a case wherein the surface 132 of the fin 130 comprises a curved surface or a twisted surface. In this embodiment, only debris 230 being scattered from the light emission point 210 toward the optical system is attracted and caught, by laterally striking or chopping them with the surface 132.

The debris removing system 100 blocks only the debris 230, on the basis of a speed difference between the EUV light and the debris 230. It is known that, usually, debris 230 moves at various speeds, from those moving at a low speed of 100 m/sec or less to those moving at a high speed of about 10,000 m/sec. Debris moving at a lower speed has a larger size and it contributes more to contamination of the mirror. A design example will be described below.

Figure 4:
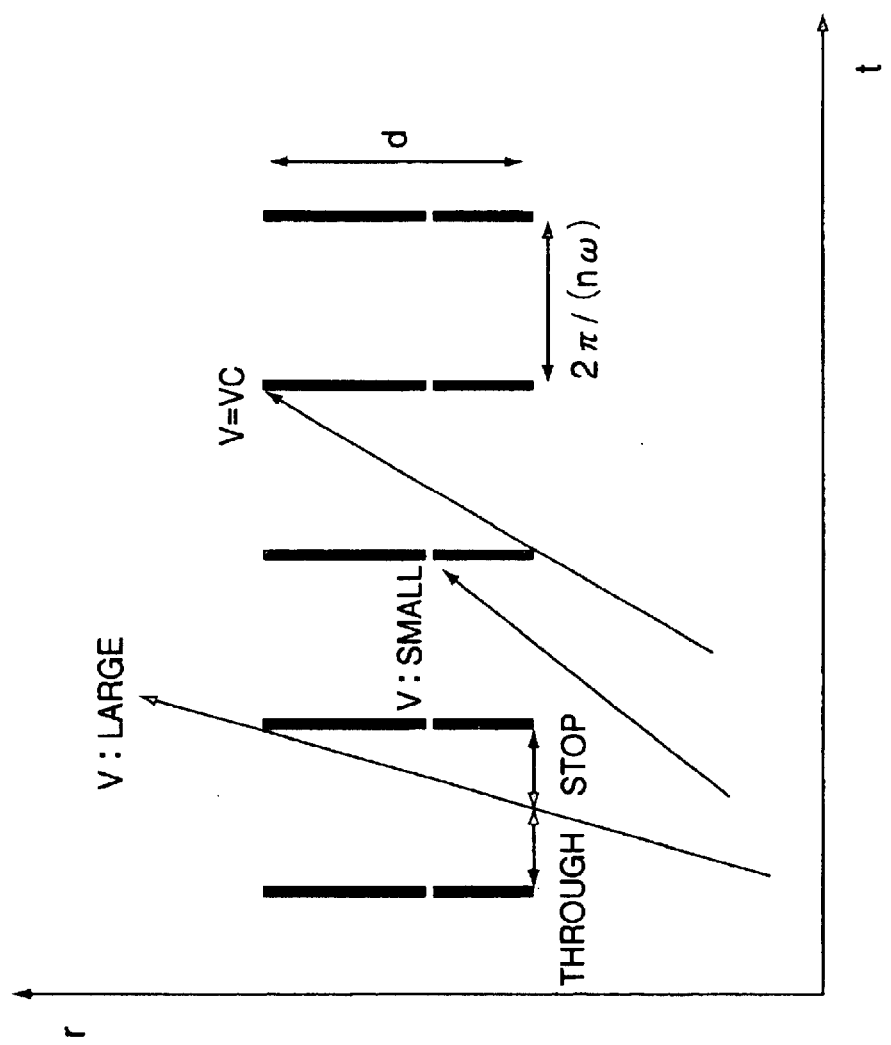
FIG. 4 is a graph for explaining debris attracting conditions.

The length of the fin 130 in the direction of divergent light is d (m), and the number of fins 130 is n (which is eight in FIG. 2). The rotational speeds is ω (rad/sec). When the distance r (m) from the light emission point 210 is taken on an axis of the ordinate and time t (sec) is taken along an axis of the abscissa, as shown in FIG. 4, the speed can be depicted by tilt. When the speed (tilt) of the debris 230 is large, the probability that debris 230 passes through between the fins becomes large. If the speed (tilt) is small, debris 230 is attracted to the fins. The time t (sec) from a moment at which a particular fin 130 goes through a certain point in a space to a moment at which a next fin passes the same point is represented by 2π/(nω). Depending on whether, during that period, debris passes through between fins 130 of a length d (m) or not, whether the debris 230 is attracted or not (i.e., passing through the fins) is determined. Thus, the highest velocity vc (m/sec) for debris for attaining complete removal can be expressed by:

$$vc = d/t = d/2\pi/(n\omega) = nd\omega/(2\pi) \quad (1)$$

If, for example, n=8, d=0.1(m) and ω=250π(rad/sec)(=7,500 rpm), then vc is 100 m/sec. Thus, it is possible to block large debris, which is mainly contributable to the mirror contamination. Also, if n=100, d=0.1(m) and ω=2,000 π(rad/sec)(=60,000 rpm), then vc is 10,000 m/sec. As regards debris moving at a speed higher than vc, it cannot be removed completely. Whether debris 230 passes the fin or it is attracted thereby is determined by the timing (phase) that, as shown in FIG. 4, the debris 130 enters the movable range of the fin 130, as depicted by regions "through" and "stop". When the speed of certain debris 230 is v(m/sec), the angle of the region "stop" is expressed by dω/v(rad). Since the spacing between the fins 130 is 2π/n(rad), the removing rate at that time can be expressed by the ratio between them.

$$R = (d\omega/v)/2\pi/n * 100 = nd\omega/(2\pi v) * 100 \quad (2)$$

Figure 5:
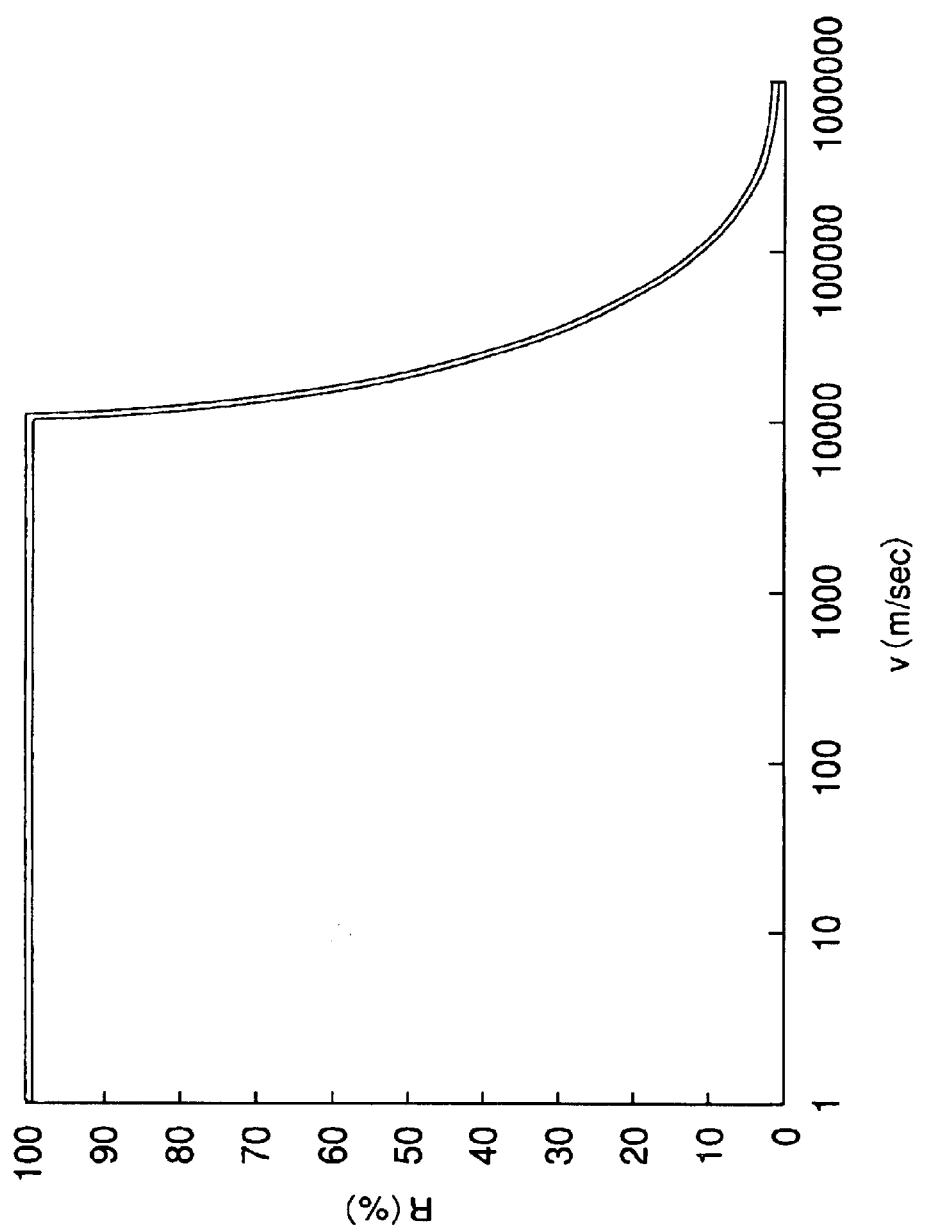
FIG. 5 is a graph for explaining the relation between the debris velocity and the debris removing efficiency.

Namely, when v>vc, the removing rate R is in inverse proportion to the debris speed v. FIG. 5 is a graph showing the removal rate. Since the speed of the light is 3×10⁸ m/sec, the probability of impingement against the fin 130 is 0.0033%, and thus, there is substantially no loss. Rather, it is more important, for attaining an increased utilization efficiency, to make the fin 130 thickness as thin as possible and also to register the shaft 120 in good alignment with the optical axis, so as to minimize the zone to be light-blocked in terms of a projected area as seen from the light emission point 210 and the light convergence point 220. When the average speed of debris 230 is vm and if a half of the debris of that speed can be blocked, the lifetime of the optical system would be extended to about twice. Thus, it can be said that the debris removing effect of this embodiment is sufficient. In that case, when the following relation is satisfied, a debris removing rate of 50% is attainable.

$$R = nd\omega/(2\pi vm) * 100 \geq 50 \quad (3)$$

Namely, if a relation $\{nd\omega/(2\pi vm)\} \geq \frac{1}{2}$ is satisfied, a debris removing rate of 50% is attainable.

Figure 3:
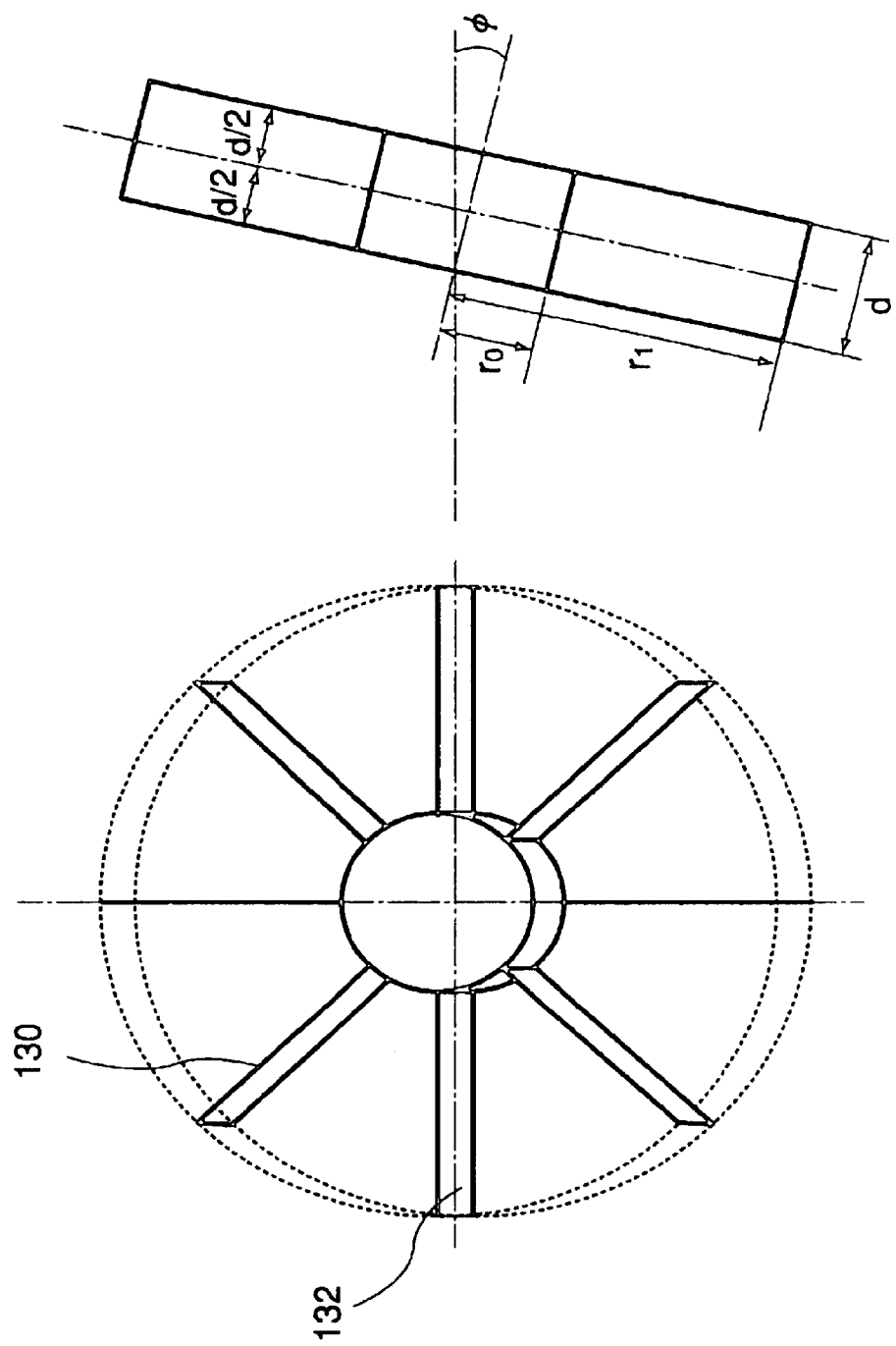
FIG. 3 is a schematic view, showing a simple model of a utilization efficiency of EUV light based on a shift of a rotational axis.

FIG. 3 illustrates a simple mode of EUV light utilization due to a shift of a rotational shaft. Here, for simplicity, it is assumed that the fin has an oblong shape and EUV light is parallel light. Divergence of EUV light is not considered. If the length of the fin in the debris diverging direction is d, the radius of the shaft that functions as a blocking portion $r_0$, and the radius of the fin including the shaft is $r_1$, and when the fin thickness is very thin as can be disregarded, the area $S_0$ through which the EUV light can pass is expressed by the following equation.

$$S_0 = \pi(r_1^2 - r_0^2) \quad (4)$$

On the other hand, if there is a tilt angle φ(0≤φ<π/2) which is defined between the rotational shaft and a straight line that connects the light emission point and a point (midpoint of the fin in the rotational direction) when the length from an edge of the fin along the rotational shaft is d/2, the area to be light-blocked by a single fin differs with the radiation angle of the fin. It takes values from 0 to $(r_1-r_0)d \sin \phi$. If there are fins of a number n, a value obtainable by multiplying this maximum value by n/2 corresponds to the area $S_1$ that the whole fins can block, and it is expressed as follows.

$$S_1 = (n/2)(r_1 - r_0)d \sin \phi \quad (5)$$

If it is defined so that it becomes equal to 100% when the shaft and the optical axis of EUV light are completely registered with each other, the utilization efficiency E (%) can be expressed as follows.

$$E = (1 - S_1/S_0) * 100 \quad (6)$$

If utilization efficiency of 50% or more is desired, then E≥50, and rearranging equations (4), (5) and (6) with respect to the tilt angle φ under this condition, we obtain:

$$0 \leq \phi \leq \arcsin(\pi(r_1 + r_0)/(nd)) \quad (7)$$

If, for example, n=8, d=0.1(m), $r_1$=0.1(m), $r_0$=0.05(m), then φ≤36 (deg) is obtained. Also, if the number of fins is enlarged to n=100, then φ≤2.7 (deg.) is obtained. Thus, the influence of axial misalignment becomes large.

In this embodiment, the whole structure is made axially symmetrical so that the reflected light is collected on an extension of the rotational shaft, and it is not blocked by the debris stopper. Therefore, the light utilization efficiency is highest.

As a matter of course, this type of debris removing system is effective also to an application using a point source X-ray source, for example, a reflectivity measuring device, a wavefront measuring device, a microscope, a shape measuring device, a medical instrument, a composite analyzer, and a structure analyzer, for example.

The projection optical system 840 comprises a projection system first mirror 842, a projection system second mirror 844, a projection system third mirror 846 and a projection system fourth mirror 848. It functions to project a circuit pattern, formed on a reticle 820, onto a wafer surface. Although the number of mirrors should be small for higher EUV light utilization efficiency, in that case, aberration correction becomes more difficult. The number of mirrors required for the aberration correction is about four to six. The shape of the reflection surface of the mirror may be a spherical or aspherical surface of a convex or concave shape. The numerical aperture NA is on an order of 0.1 to 0.3. Each mirror can be produced by cutting and polishing a substrate, made of a material having a high rigidity, a high hardness, and a small thermal expansion coefficient, such as a low thermal expansion glass or silicon carbide, for example, to generate a predetermined reflection surface shape, and then by forming a multilayered film, such as molybdenum/silicon, on the reflection surface.

A reticle stage 824 and a wafer stage 854 are scanningly moved in synchronism with each other, at a speed ratio proportional to the reduction magnification. Here, the scan direction along the reticle 820 surface or wafer 850 surface is taken as X, while a direction perpendicular to it is taken as Y. A direction perpendicular to the reticle 820 surface or wafer 850 surface is taken as Z.

The reticle 820 has a desired pattern formed thereon, and it is held by a reticle chuck 822 provided on the reticle stage 824. The reticle stage 824 has a mechanism for motion in the X direction. Also, it has fine-motion mechanisms in X, Y and Z directions as well as rotational directions about these axes, and it serves to accomplish the positioning of the reticle 820. The position and posture of the reticle stage 824 are measured by means of a laser interferometer, and the position and posture are controlled on the basis of the result of the measurement.

The wafer 850 is held on the wafer stage 854 by means of a wafer chuck 852. The wafer stage 854 has a motion mechanism for motion in the X direction, like the reticle stage 824. Also, it has fine-motion mechanisms in X, Y and Z directions as well as rotational directions about these axes, to accomplish the positioning of the wafer 850. The position and posture of the wafer stage 854 are measured by means of a laser interferometer, and the position and posture are controlled on the basis of the result of measurement.

The positional relation between the position of the reticle 820 and the optical axis of the projection optical system 840 as well as the positional relation between the position of the wafer 850 and the optical axis of the projection optical system 840 are measured by means of an alignment optical system 830, and the positions and angles of the reticle stage 824 and the wafer stage 854 are set so that a projected image of the reticle 820 is registered with a predetermined position on the wafer 850. On the other hand, the focus position at the wafer 850 surface with respect to the Z direction is measured by means of a focus detecting optical system 832. By controlling the position and angle of the wafer stage 854, during the exposure process, the wafer surface can be held at the imaging position of the projection optical system 840.

When one scan exposure on the wafer 850 is completed, the wafer stage 854 moves stepwise in the X and/or Y direction to move the wafer to the subsequent scan exposure start position. Then, the reticle stage 824 and the wafer stage 854 scanningly moved again at a speed ratio proportional to the reduction magnification of the projection optical system.

In this manner, the operation of synchronized scan of the reticle 820 and the wafer 850 while a reduced and projected image of the reticle is being projected on the wafer, is repeated (step-and-scan). The operation is repeated until the transfer pattern of the reticle 820 is transferred to the whole surface of the wafer 850.

In order to prevent EUV light from being absorbed by a gas, the space through which the EUV light is propagated or a space wherein optical elements are disposed, should be maintained at a predetermined pressure level or lower. To this end, the light source and the optical elements of the illumination optical system and of the projection optical system as well as the reticle 820 and the wafer 850 are accommodated in a vacuum container 860, and it is exhausted to satisfy a predetermined vacuum level. While a single container is used in this embodiment, plural vacuum containers may be used to maintain a predetermined pressure for the illumination optical system and the projection optical system, separately, by using different containers.

Figure 6:
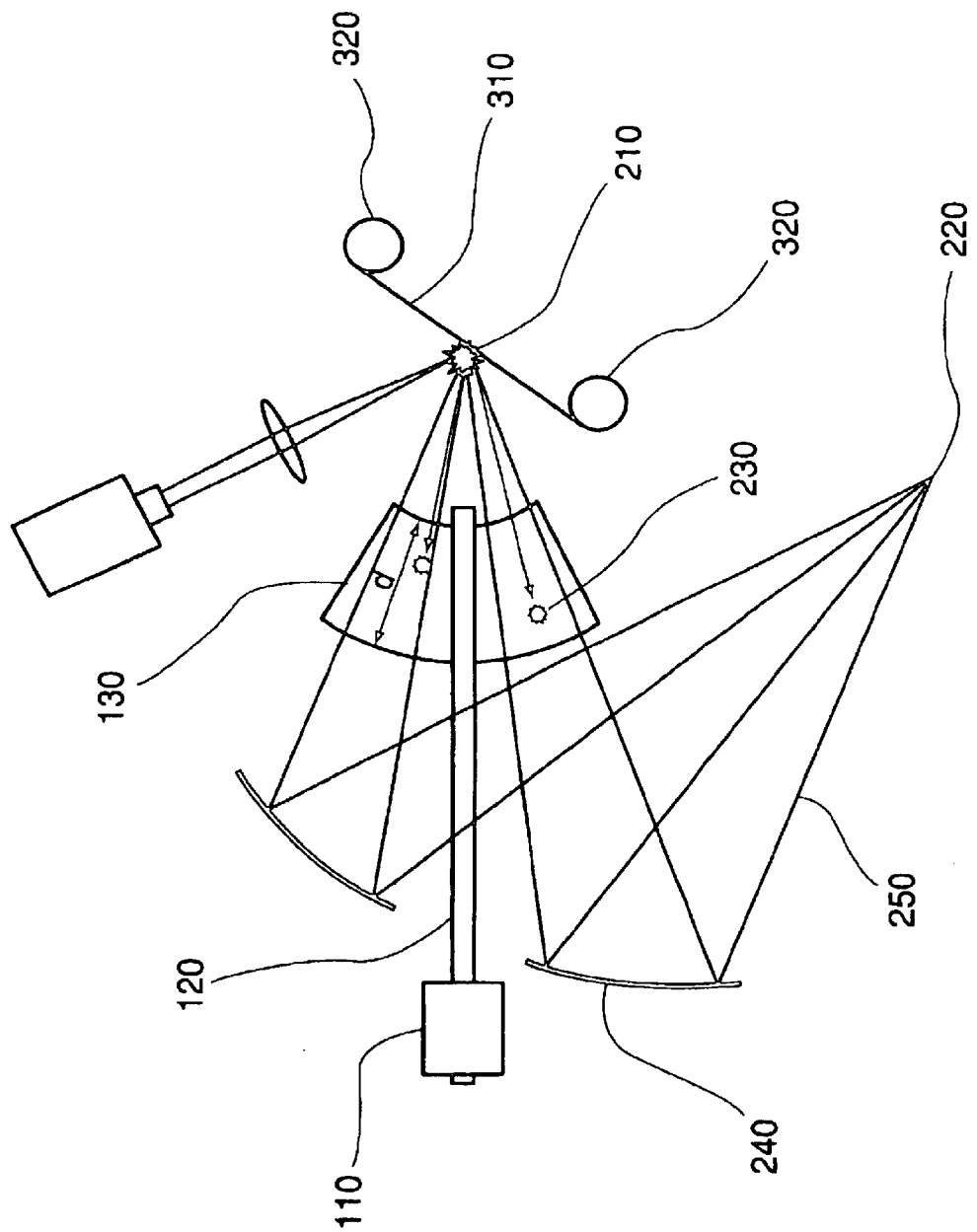
FIG. 6 is a schematic view of a laser plasma light source and a debris removing system according to an embodiment of the present invention.

FIG. 6 is a schematic view of a laser plasma light source and a debris removing system according to an embodiment of the present invention. This embodiment uses a structure that, in the laser plasma method, a metal target 310 such as Cu, for example, is formed into a tape-like element which is fed by reels 320 so that a fresh surface can be used. With this structure, the size of the mechanism for the light emitting portion becomes large to some degree, and thus, it becomes difficult to place the light emission point 210 and the light converging point 220 on the same axis, as shown in FIG. 2. In consideration of this, an off axis structure is used as shown in FIG. 6. With this structure, the fins 130 must be disposed so as not to interfere with the reflection light. If the length d(m) of the fin 130 is in the divergent light direction, the condensing mirror 240 has to be moved away and, therefore, the mirror becomes large. Also, both the light collection efficiency and the debris removing rate are lower as compared with a structure as shown in FIG. 2B wherein the target material 270 is supplied by means of the nozzle 260. However, there is an advantage that the design freedom for the light source structure is large.

Figure 7:
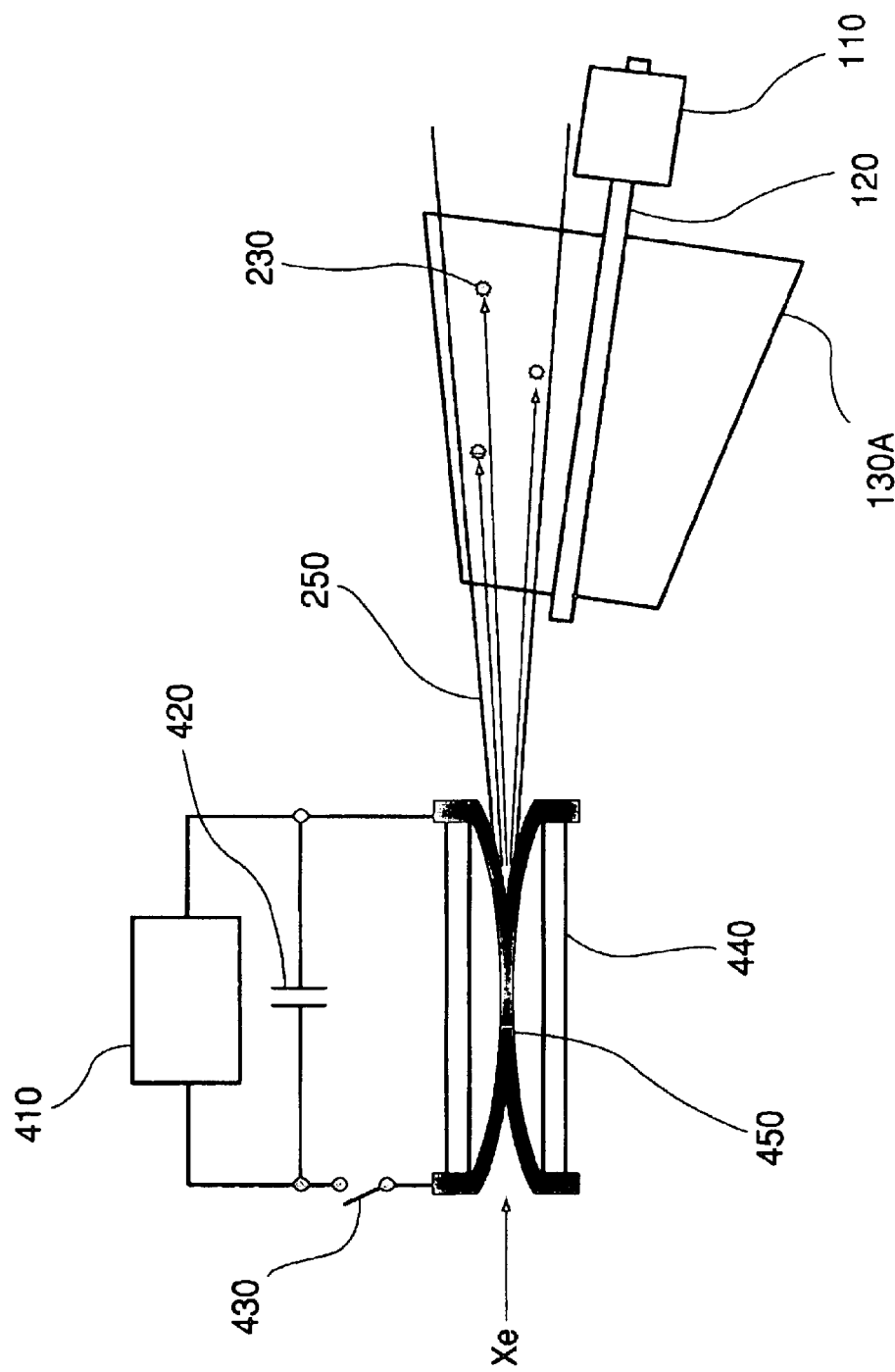
FIG. 7 is a schematic view of a debris removing system according to an embodiment of the present invention.

The light source unit of an exposure apparatus is not limited to the one disclosed in this embodiment. FIG. 7 is a schematic view showing a Z-pinch type light source, which is one of discharging types, and a debris removing system. Denoted at 410 is a high voltage source in which energies are accumulated in a capacitor 420. When a switch 430 is turned on, plasma 450 is produced in an enclosure 440, whereby EUV light 250 is produced. Simultaneously therewith, debris 230 is produced, but it can be attracted by fins 130A of the debris removing system. In the discharging method, since taking a solid angle is small, even if the light emission point shifts slightly off the extension of the rotary shaft, the light collection efficiency does not change largely. As regards the shape of the fins 130A of this embodiment, it differs from that of the fins 130, and it is formed into a trapezoidal shape.

As regards the discharging type, in addition to those disclosed above, there are plasma focus type, capillary discharging type, hollow-cathode triggered Z-pinch type, and the like. Similar debris removing systems may be applied to them.

Figure 8:
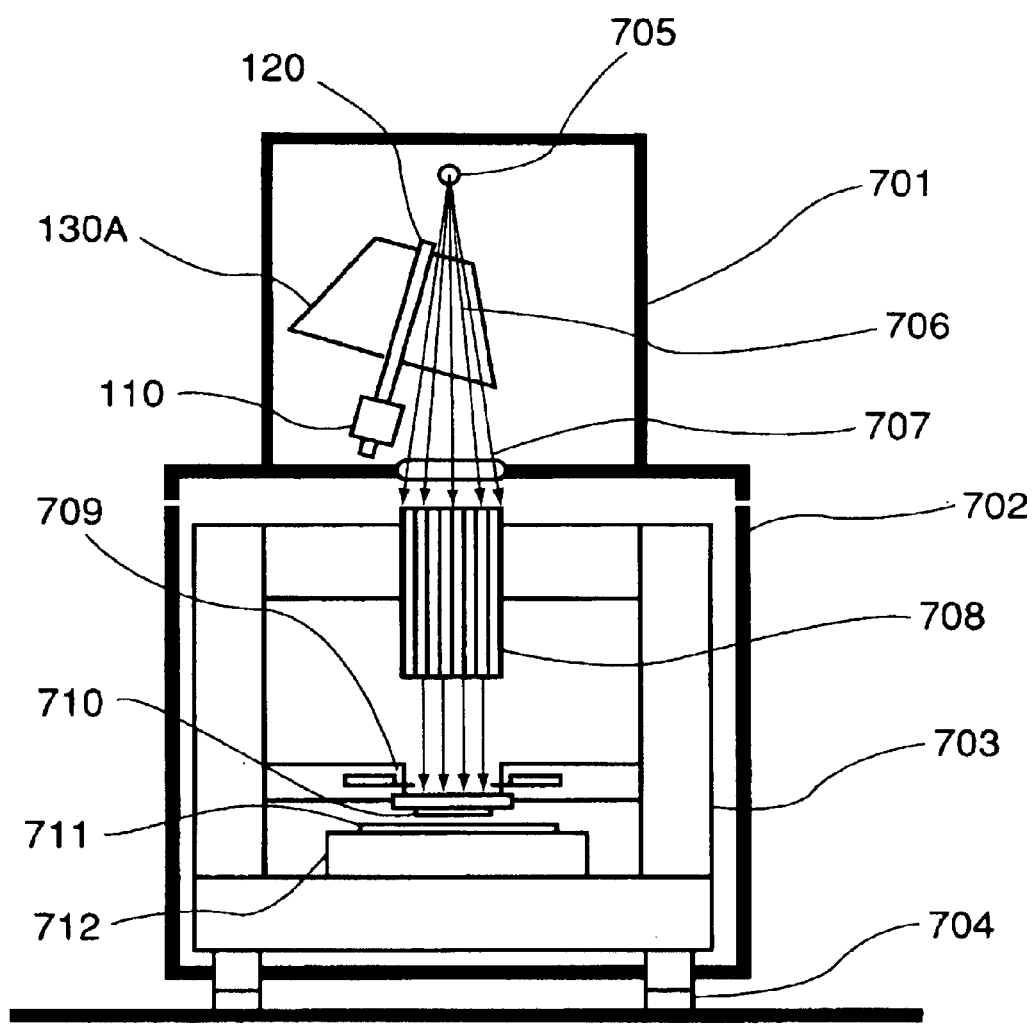
FIG. 8 is a schematic view of a proximity X-ray exposure apparatus according to an embodiment of the present invention.

FIG. 8 is a schematic view of a proximity X-ray exposure apparatus in which a point-source light source is used. The proximity X-ray lithography is a method in which soft X-rays having a wavelength of about 1 nm is used and, while placing a mask (original) in close proximity to a wafer by about 10 microns, a unit-magnification exposure is carried out the light source may have a similar structure as that of the EUV light source, and it may be optimized to obtain a desired wavelength.

Denoted in FIG. 8 at 701 is a light source chamber which is maintained at a high vacuum. Denoted at 702 is a main-assembly chamber in which He gas is controlled at about 20 KPa. Denoted at 703 is a structural member for supporting components of the apparatus. Denoted at 704 is an anti-vibration mechanism for isolating vibration from being transmitted from the floor.

Denoted at 705 is a light emission point from which X-rays are emitted. The X-rays then pass through an X-ray extracting window 707 and enter a collimator 708 by which they are transformed into parallel light. The thus produced parallel X-ray beam is received by a masking blade 709, by which the view angle is restricted. The X-ray beam then impinges on a mask 710, such that a pattern of the mask is transferred to a wafer 711 being coated with a resist. The wafer 711 is held by a wafer stage 712 and, through the stepwise motion, the whole wafer surface can be exposed.

Even in such proximity X-ray lithography, debris is produced from the X-ray source, and it may contaminate and damage the X-ray extracting window. Thus, like the foregoing embodiments, a driving member having fins 130A is driven to thereby effectively remove the debris. As regards the shape of the fins 130A of this embodiment, it differs from that of the fins 130, and it is formed into a trapezoidal shape.

Next, referring to FIGS. 9 and 10, an embodiment of a device manufacturing method using an exposure apparatus described above, will be explained.

Figure 9:
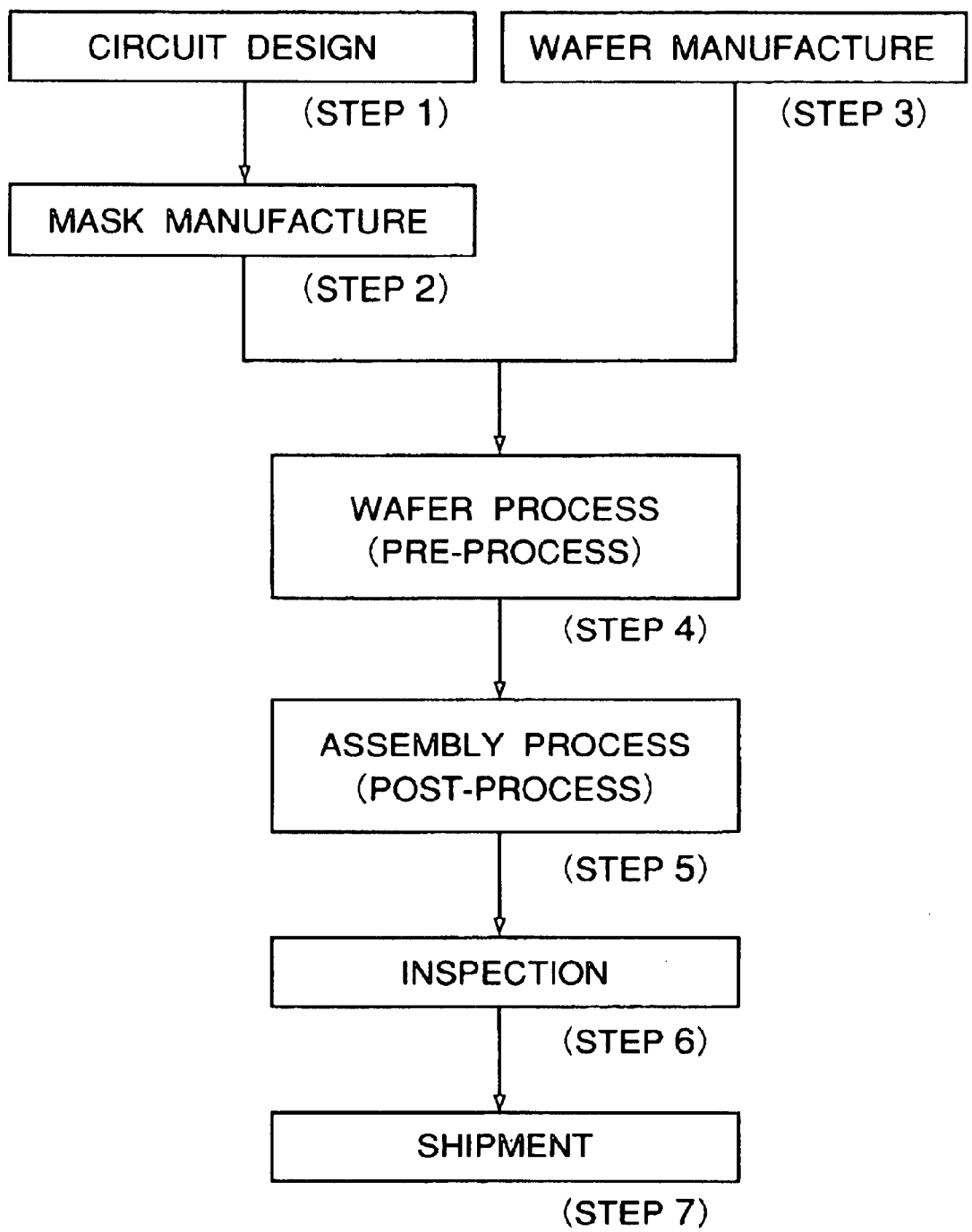
FIG. 9 is a flow chart for explaining device manufacturing processes, including an exposure step, according to an embodiment of the present invention.

FIG. 9 is a flow chart for explaining the procedure of manufacturing various microdevices such as semiconductor chips (e.g., ICs or LSIs), liquid crystal panels, or CCDs, for example. Here, a description will be made of the manufacture of semiconductor chips, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check and so on, for the semiconductor devices produced by step 5, are carried out. With these processes, semiconductor devices are produced, and they are shipped (step 7).

Figure 10:
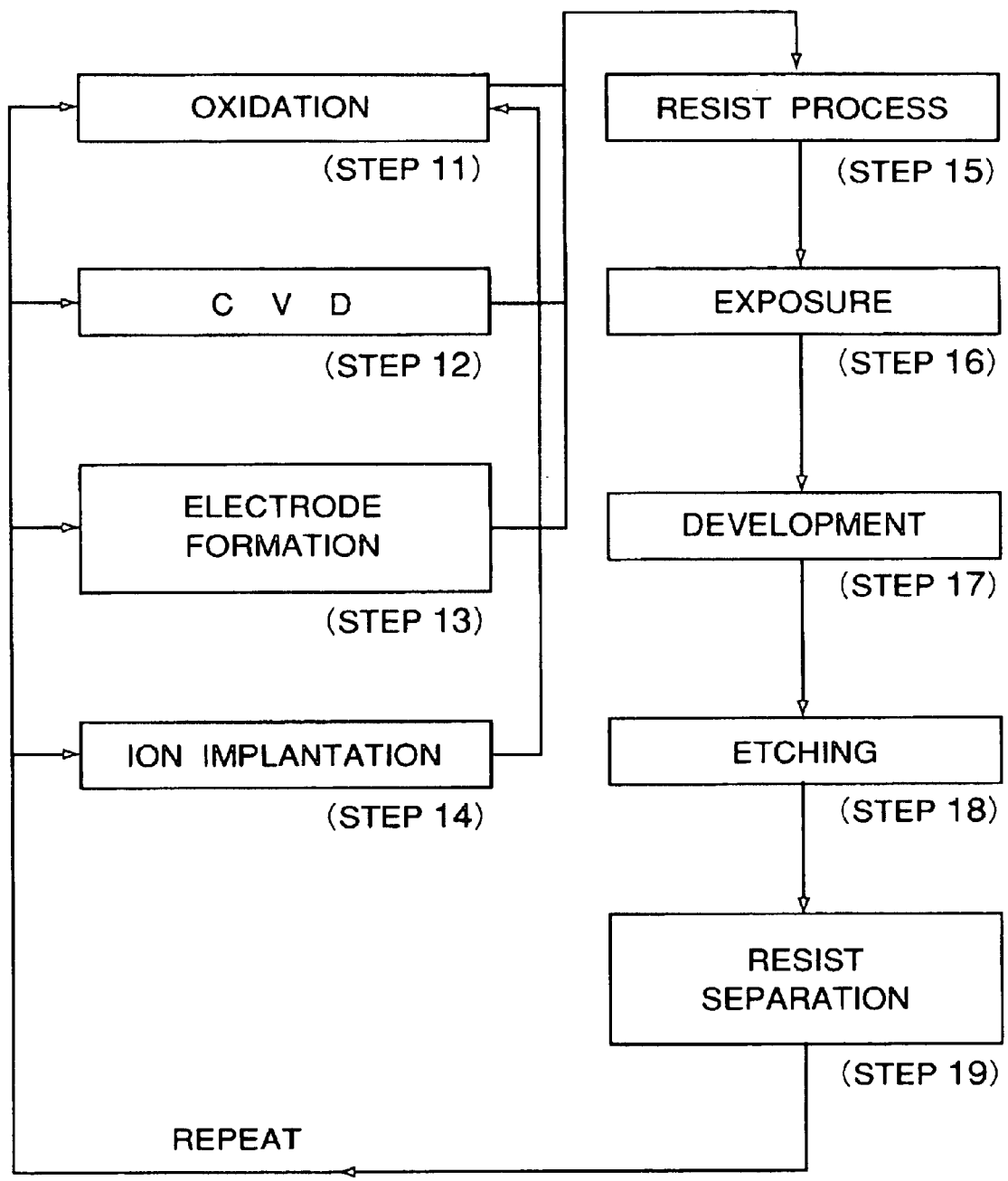
FIG. 10 is a flow chart for explaining details of step 4 in FIG. 9.
Figure 11:
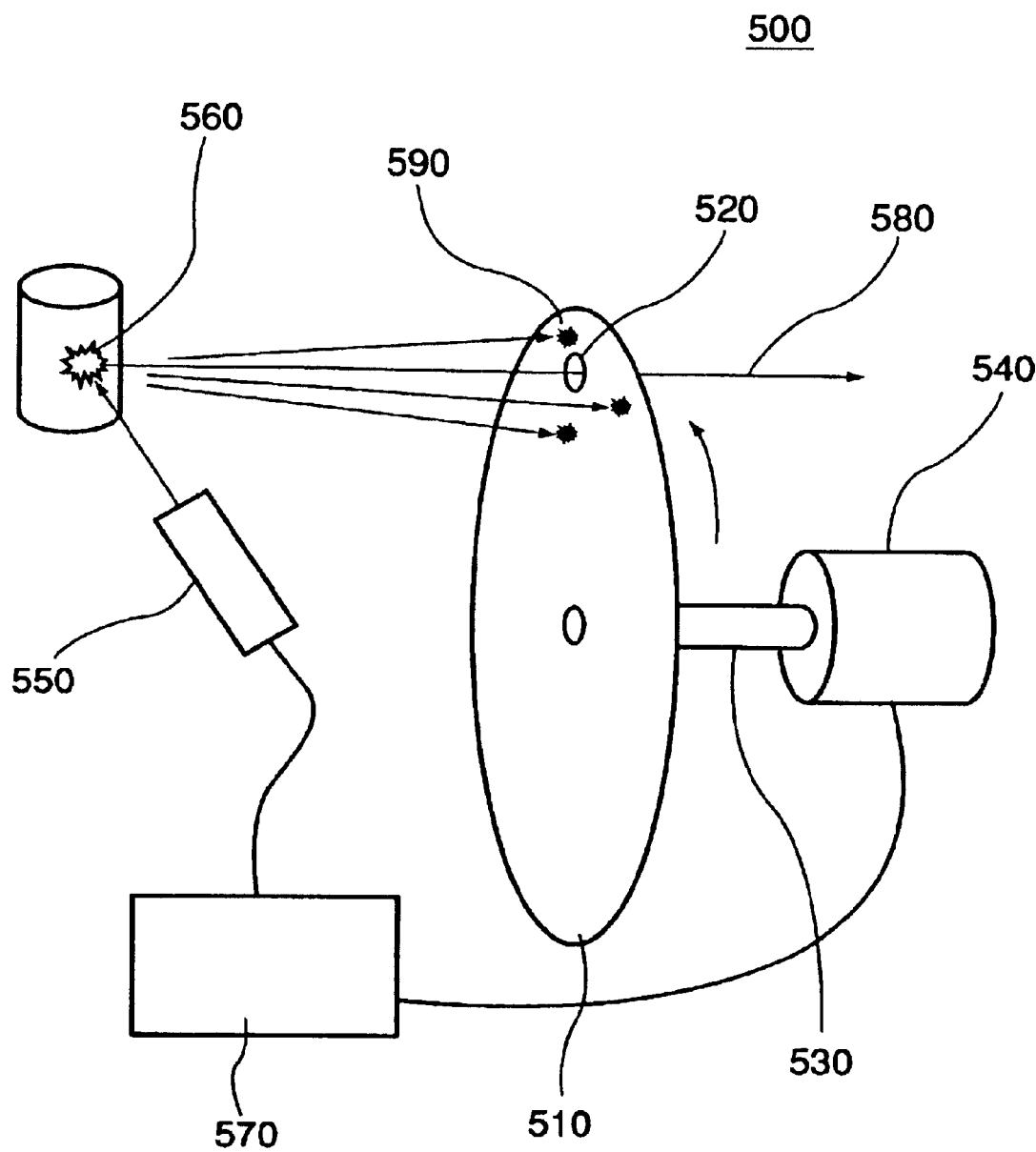
FIG. 11 is a schematic view of a debris removing system of a known type.
Figure 12:
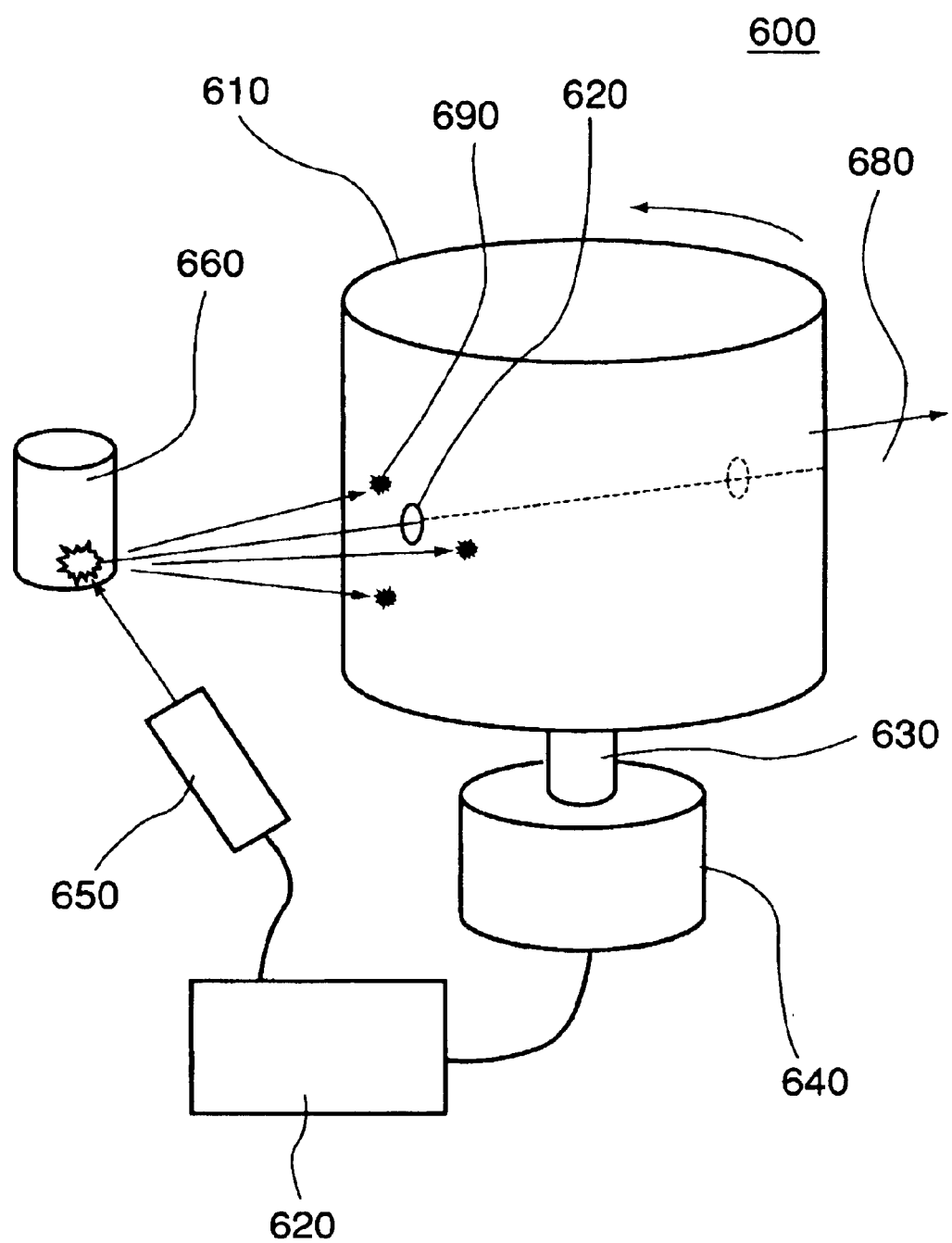
FIG. 12 is a schematic view of a debris removing system of a known type.

FIG. 10 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the manufacturing method of this embodiment, devices of higher quality as compared with conventional methods can be produced. Further, if the light emission period is at a few KHz for mass-production level, there is no necessity of taking synchronism with the pulse light emission, which requires very complicated procedures. Therefore, the control is very simple.

While the invention has been described with reference to the structures disclosed herein, it is not confined to the details set forth and this application is intended to cover such modifications or changes as may come within the purposes of the improvements or the scope of the following claims.

What is claimed is:

1. A debris removing system for preventing debris, being scattered from an X-ray source, from reaching an optical system, comprising:
    an attracting unit disposed between a light emission point of the X-ray source and the optical system, for attracting debris, said attracting unit having an attracting surface parallel or approximately parallel to an axis passing through the light emission point; and
    a rotation unit for rotating said attracting unit about the axis.

2. A debris removing system according to claim 1, wherein said attracting unit includes fins of a number n, functioning as said attracting surface, wherein the fins have a length $d(m)$ in a divergent direction of X-rays, wherein said rotation unit rotates the fins about the axis at a rotational speed $w(rad/sec)$, and wherein, where an average speed of the debris is $vm(m/sec)$, there is a relation $100 \pounds ndw/(2p)$.

3. A debris removing system according to claim 1, wherein said attracting unit includes fins of a number n, functioning as said attracting surface, wherein the fins have a length $d(m)$ in a divergent direction of X-rays, wherein said rotation unit rotates the fins about the axis at a rotational speed $w(rad/sec)$, and wherein, where an average speed of the debris is $vm(m/sec)$, there is a relation $\{ndw/(2pvm)\}^{3\frac{1}{2}}$.

4. An illumination system for illuminating a mask, comprising:
    a debris removing system as recited in claim 1, for passing X-rays from an X-ray source therethrough; and
    an optical system for directing X-rays from said debris removing system toward a mask.

5. An exposure apparatus for exposing a workpiece, comprising:
    an illumination system as recited in claim 4; and
    a projection optical system for projecting X-rays from the mask onto the workpiece.

6. A device manufacturing method, comprising the steps of:
    exposing a workpiece by use of an exposure apparatus as recited in claim 5; and
    developing the exposed workpiece.

7. An exposure apparatus for exposing a workpiece, comprising:

an illumination system as recited in claim 4;

wherein the workpiece is disposed in proximity to the mask.

8. A device manufacturing method, comprising the steps of:

exposing a workpiece by use of an exposure apparatus as recited in claim 7; and developing the exposed workpiece.

9. A light source unit, comprising:

an X-ray source in which a gas is flown to an electrode to produce plasma, thereby to produce X-rays; and a debris removing system as recited in claim 1.

10. A light source unit, comprising:

an X-ray light source in which plasma is produced, by use of laser light, thereby to produce X-rays; and a debris removing system as recited in claim 1.

11. A debris removing system for preventing debris, being scattered from an X-ray source, from reaching an optical system, comprising:

an attracting unit disposed between a light emission point of the X-ray source and the optical system, for attracting debris, said attracting unit having an attracting surface parallel or approximately parallel to an axis passing through the light emission point; and a rotation unit for rotating said attracting unit about a predetermined axis, at a rotational speed of w(rad/sec);

wherein there is a relation 100 £ndw/(2p).

12. A debris removing system for preventing debris, being scattered from an X-ray source, from reaching an optical system, comprising:

an attracting unit disposed between a light emission point of the X-ray source and the optical system, for attracting debris, said attracting unit having an attracting surface parallel or approximately parallel to an axis passing through the light emission point; and a rotation unit for rotating said attracting unit about a predetermined axis;

wherein said attracting unit includes fins of a number n, functioning as said attracting surface, wherein the fins have a length d(m) in a divergent direction of X-rays;

wherein the following relations are satisfied:

$S_0 = p(r_1^2 - r_0^2)$ $S_1 = (n/2)(r_1 - r_0)d\sin f$ $E = (1 - S_1/S_0) \times 100$ $E^3 50$ $0 £ f £ \arcsin(p(r_1 + r_0)/(nd))$ where $r_0$ is a radius of the rotation unit about the predetermined axis, $r_1$ is a radius of the attracting unit about the predetermined axis, $S_0$ is an area through which X-rays from the light emission point can pass, f is a tilt angle ($0 £ f < p/2$) defined between the rotational axis and a straight line connecting the light emission point and a midpoint of the rotation unit along the predetermined axis, $S_1$ is an area for blocking the light with the fins, and E is the utilization efficiency (%) being defined so that the utilization efficiency becomes equal to 100% when the predetermined axis and the straight line are registered with each other.

13. A debris removing system for preventing debris, being scattered from an X-ray source, from reaching an optical system, comprising:

an attracting unit disposed between a light emission point of the X-ray source and the optical system, for attracting debris; and a rotation unit for rotating said attracting unit about an axis passing through the light emission point.

* * * * *

UNITED STATES PATENT AND TRADEMARK OFFICE
CERTIFICATE OF CORRECTION

PATENT NO.    : 6,867,843 B2
DATED         : March 15, 2005
INVENTOR(S)   : Nobuaki Ogushi et al.

It is certified that error appears in the above-identified patent and that said Letters Patent is hereby corrected as shown below:

Column 3,
Line 33, "attracting," should read -- attracting --.

Column 6,
Line 48, after "motor", the right margin should be closed up.
Line 49, the left margin should be closed up and "10," should read -- 110, --.

Column 7,
Line 37, "speeds" should read -- speed --.

Column 12,
Lines 41 and 48, "w(rad/sec)," should read -- ω(rad/sec), --.
Line 42, "100 £ndw/(2p)." should read -- 100 ≤ndω/(2π). --.
Line 49, "{ndw/(2" should read -- {ndω/(2 --.
Line 50, pvm)}$^3$½." should read -- πvm)}≥½. --.

Column 13,
Line 31, "100 £ndw/(2p)." should read -- 100 ≤ndω/(2π). --.
Line 33, "w(rad/sec);" should read -- ω(rad/sec); --.

Column 14,
Line 10, "$S_0=p(r_1^2 - r_0^2)$" should read -- $S_0=\pi(r_1^2 - r_0^2)$ --.
Line 11, "$S_1=(n/2)(r_1-r_0)dsinf$" should read -- $S_1=(n/2)(r_1-r_0)dsin\phi$ --.
Line 13, "$E^3 50$" should read -- E≥50 --.
Line 15, "0£f£ arcsin(p($r_1$ + $r_0$)/(nd))" should read -- 0 ≤φ≤ arcsin(π($r_1$ + $r_0$)/(nd)) --.
Line 21, "f" should read -- φ -- and "(0£f<p/2)" should read -- (0≤φ<π/2) --.

Signed and Sealed this

Thirtieth Day of August, 2005

JON W. DUDAS
*Director of the United States Patent and Trademark Office*